June 27, 1967 H. SANDMANN ETAL 3,328,272

PROCESS USING AN OXYGEN FREE ELECTROLYTE FOR DOPING AND CONTACTING SEMICONDUCTOR BODIES

Original Filed Jan. 12, 1960 2 Sheets-Sheet 1

3,328,272
Patented June 27, 1967

3,328,272

PROCESS USING AN OXYGEN FREE ELECTROLYTE FOR DOPING AND CONTACTING SEMICONDUCTOR BODIES

Herbert Sandmann and Richard Dotzer, Nurnberg, Germany, assignors to Siemens-Schuckertwerke Aktiengesellschaft, Berlin-Siemensstadt, Germany, a corporation of Germany Application Mar. 8, 1962, Ser. No. 178,428, now Patent No. 3,261,773, which is a division of application Ser. No. 1,921, Jan. 12, 1960. Divided and this application Oct. 18, 1965, Ser. No. 498,206
Claims priority, application Germany, Jan. 12, 1959, S 61,298
15 Claims. (Cl. 204—37)

This is a division of application Ser. No. 178,428, filed Mar. 8, 1962, now Patent No. 3,261,773, which in turn is a division of application Ser. No. 1,921, filed Jan. 12, 1960, now abandoned.

Our invention relates to an apparatus for doping, or simultaneously doping and contacting, a crystalline semiconductor body for junction type rectifiers, transistors and other electric semiconductor devices. Such doping and contacting serves for providing the semiconductor body, consisting of silicon, germanium, gallium arsenide or other semiconductor substances, with a zone of p-type or n-type electric conductance. The conductance type affected by the doping substance may be the same as inherent in the semiconductor material as such, so that an ohmic junction in the semiconductor is produced, or the semiconductor zone may be doped for a conductance type opposed to that of the original semiconductor body so that a p-n junction is produced.

The conventional means for doping semiconductor bodies with lattice defection atoms of a given conducttance character are generally based upon a diffusion or alloying process. In most cases the doping material is placed in the form of a foil upon the semiconductor body, and the diffusion or alloying process is subsequently carried out by heat-treatment. It has been found, however, that the transition or junction zone thus formed in the semiconductor body may assume a very irregular boundary face. This tends to greatly reduce the electric breakthrough strength of semiconductor devices made in this manner, such as an area-type rectifier with p-n junction on the basis of a semiconductor of germanium or silicon for example, as compared with the theoretically expectable voltage values.

The present invention is predicated upon the recognition that these detrimental and irregular phenomena can be explained by the fact that the foil of doping material, at its surface contacting the surface of the semiconductor body, is not in the desired pure condition but may be coated with an oxide skin. When performing the diffusion or alloying process by a thermal treatment with such a foil, the presence of an oxide skin may cause the material lose in the oxide coating the surface tension or other surface properties previously inherent in the material. This results in the formation of localities or "nests" at the boundary face between the doping material being melted and the semiconductor material. Consequently the diffusion or alloying of the doping material into the semiconductor material progresses irregularly so that the resulting boundary face of the junction does not have the desired planar or smooth configuration but possesses smooth or pointed projections and grooves. This condition makes it impossible to reliably secure the expected thickness of the portion not affected by the diffusion or alloying process and located between the transition zones of the two doped zones in the semiconductor material.

It is therefore an object of our invention to avoid the above-mentioned irregularities and to thus improve the products by securing uniform results of good quality. We have found that this object can be achieved by means which deposit the doping material upon the semiconductor body by means of a precipitation process in pure and finely distributed condition so that detrimental surface layers between the doping material and the semiconductor material cannot be produced.

It is also an object of our invention to provide means not only to eliminate detrimental surface coatings that may be present upon the deposited doping material, but to also eliminate any coatings which may be formed upon the surface of the semiconductor material itself.

In accordance with our invention therefore, we provide means to subject a semiconductor body for the manufacture of area-type rectifiers, transistors and other semiconductor devices to a precipitation process by means of which the doping material is precipitated in the finest distributed form from the environment of the semiconductor body onto its surface and subsequently to subject the coated semiconductor body to diffusion or alloying by heat-treatment for producing the doped zones of the desired thickness in the semiconductor body.

According to another, preferred feature of our invention, means are provided for effecting the precipitation electrolytically by exposing the semiconductor area to be doped to a bath or melt of an electrolyte containing the doping substance.

The apparatus according to the invention comprises a vessel or container for the electrolyte, and a carrier mounted in the container for holding the semiconductor body to be provided with precipitated doping material or dope-containing electrode material, the carrier consisting of material resistant to the electrolyte and being designed for attaching the semiconductor body to be processed, by clamping action. At the location where the semiconductor body is attached, the carrier is provided with a terminal contact to which an electric lead is connected. When inserting or attaching the semiconductor body to be treated, it directly enters into an electric connection with the terminal contact, and the point of connection is shielded automatically against the electrolyte by coaction of the carrier and the semiconductor body accommodated thereupon.

The precipitation process performed by the apparatus embodying the invention is preferably preceded by a processing step for purifying the surface of the semi-conductor body before precipitation is started. This surface treatment is either mechanical or chemical. If a mechanical surface treatment is used, a subsequent etching treatment must be applied. It is preferable therefore to treat the semiconductor surface by means of a liquid medium. Such treatment may be effected by means of the same solution or liquid from which the doping substance in purest-feasible form is to be electrically precipitated upon the semiconductor surface. The electrolytic precipitation is preferably performed with a current density of approximately 1 milliamp per cm.$^2$ at a temperature of approximately 100° C. Within a few minutes the dark grey cathode side of the silicon disc becomes coated with a shining silvery, fine-crystalline, uniform layer of extremely pure aluminum which can be brought up to the desired thickness by continuing the electrolysis a corresponding length of time. The electroplating can be carried out with silicon discs having a specific resistance of up to 35,000 ohm-cm., preferably while the disc is being illuminated or otherwise irradiated. After subsequent tempering, the diffusion front exhibits an extremely planar configuration.

The apparatus according to the invention may be used for doping only given surface areas of the semiconductor body. For this purpose, the other surface portions of the semiconductor material can be masked or otherwise covered or screened off during precipitation by a stencil which permits the doping substance or the electrolyte access to the semiconductor body only at the desired surface areas. For this purpose, the semiconductor body may be located in an opening in the wall of the electrolyte-containing vessel so that only the surface area to be doped is exposed to the electrolyte.

When the semiconductor body is first subjected to a surface treatment by an etching process for the purpose of purifying the surface area to be doped, a skin may remain on the pre-treated surface. We have found that when such semiconductor bodies are subsequently doped or contacted by an alloying or diffusion process, such an aqueous skin may impair the precipitating operation and hence result in inferior or irregular products. Thus a pre-cleaning of the semiconductor surface by etching is involved. We preferably employ a dope-containing electrolyte of such constitution that when the electrolyte contacts the aqueous skin, a chemical reaction takes place which consumes and eliminates any water as may be still present on the semiconductor surface.

The invention is particularly suitable for the purpose of doping semiconductor material, for example silicon, with aluminum which simultaneously serves to form an electrode for attaching an electric connection to the processed zone of the semiconductor body. Aluminum is particularly known as a substance which readily tends to form an oxide coating which is relatively stable and generally difficult to eliminate. For precipitating aluminum in purest form from an electrolyte, we have found it preferable to use a non-aqueous, oxygen-free aluminum compound as the electrolyte. Particularly suitable in this respect were found to be complex compounds of aluminum which may be of organic character. Such organic complex aluminum compounds for example are alkali-fluor aluminum-trialkyl compounds. Suitable for example among such compounds is $NaF \cdot 2Al(C_2H_5)_3$. This substance has the particularity that in the event water, or a water skin, is present an exothermic reaction takes place so that in any event the water is directly consumed and eliminated by a chemical reaction.

The electrolyte, when it consists of $NaF \cdot 2Al(C_2H_5)_3$, can be produced in acordance with the reaction equation:

$$\underset{42.0}{NaF} + \underset{228.3}{2Al(C_2H_5)_3} \xrightarrow{110^\circ C} \underset{270.3}{NaF \cdot 2Al(C_2H_5)_3}$$

For this purpose, a fine dust of NaF is first dried in vacuum at 150° C. while being kept stirred, for example in a vibrating mixer vessel. After drying and cooling of the dust, the vessel is scavenged with purified nitrogen. Thereafter aluminum triethyl is supplied with a slight excess (5%) above the stoichiometric quantity. The mixture is intensively stirred and heated to 110 to 120° C. Within one to two hours the NaF is dissolved. Due to the slight excess of aluminum triethyl, the resulting, practically colorless electrolyte is liquid at normal room temperature (20° C.).

The electrolyte $NaF \cdot 2Al(C_2H_5)_3$ has a melting point of approximately 35° C. It is instable relative to air, oxygen and water but does not react with these as vigorously as the aluminum triethyl.

The electric conductivity of the $NaF \cdot 2Al(C_2H_5)_3$ electrolyte at 100° C. is approximately $2.2.10^{-2}$ ohm$^{-1}$-cm.$^{-1}$. When it is kept in a container that is not hermetically sealed, the conductance declines within 48 hours to about $2.0.10^{-2}$ ohm$^{-1}$-cm.$^{-1}$ due to oxidation of the electrolyte by the oxygen in the air.

Depending upon the kind of semiconductor body to be processed, different doping substances are applicable. For example in the case of germanium as semiconductor body, the doping may be effected with indium or gallium. These two substances, appertaining to the elements of the third main group of the periodic system, can individually substitute the aluminum in the complex compound used as electrolyte.

In order to perform the electrolysis sufficiently, it is desirable that the semiconductor body, immersed in the electrolyte as a cathode, have smallest possible specific electric resistance. This resistance, in general, is predetermined at normal room temperature (20° C.) by the pure, doped or pre-doped semiconductor body which is being used as the starting material for the production of the semiconductor device. According to the invention, however, the desired reduction in resistance of the semiconductor body when performing the electrolytic precipitation process can be achieved by performing this process at a given increased temperature of the semiconductor body so as to utilize the temperature dependence of the specific electric resistance of the particular semiconductor material. For this purpose either the electrolyte is heated and kept at a corresponding temperature, or the semiconductor itself may be subjected to corresponding heating.

The semiconductor body may be subjected to a source of radiation located outside the processing vessel, so that an activation of the semiconductor zone near its surface will take place, thus increasing the specific electric conductance in this surface zone. Suitable radiation for this purpose, for example, is heat radiation having a wave length in the range of 1 to 500$\mu$. However the radiation may also have such character that it only causes the formation of a photo effect at the surface of the semiconductor body, which also has the result of increasing the elastic conductance in a surface zone of the semiconductor material.

When the specimen is to be illuminated or irradiated through the wall of the electrolysis vessel, the vessel may consist of Jena glass having a permeability to light within the optical range of 0.5 to 2.5 microns.

In some cases it has been found preferable to provide means for performing the electrolysis in an oxygen-free medium. For this purpose the electrolysis device may be located within a protective gas atmosphere for example in nitrogen or an inert gas from the helium group of the periodic system.

Thus the container with the electrolyte is preferably gas-tightly sealed toward the outside, and the space above the level of the electrolyte is preferably filled with the protective gas, such as nitrogen or a noble gas, while the process of precipitating the doping substance upon the semiconductor is in progress. As a result, no undesired oxide coating can occur at the mutual areas of engagement between the precipitate and the semiconductor body. Such an oxide coating would impair or prevent a satisfactory mutual wetting between the precipitated material and may thereby cause an undesired shape of the alloying front that advances into the semiconductor body during the subsequent thermal treatment needed for producing the desired doping.

During the electrolysis, means may be provided to simultaneously subject the semiconductor silicon body to a heat treatment at a maximum temperature of 300° C. to reduce its specific resistance.

For producing a good adherent and completely planar aluminum coating of hyper-pure aluminum, before the electrolytic process is carried out, it is important to first subject the silicon disc to a pre-treatment, for example as follows.

The lapped silicon discs are first heated in concentrated sulfuric acid up to the occurrence of sulfuric acid fog. Then the hot sulfuric acid is decanted, the discs are permitted to cool and are then repeatedly washed with distilled water. Subsequently the discs are immersed in acetone. For the etching proper, the silicon discs, still moistened with acetone, are dried with paper tissue. The silicon discs are then immersed in an etching solution in a polyethylene container. The etching solution consists of one part by volume of 40% hydrofluoric acid, one part by volume of fuming nitric acid, one part by volume of acetic acid. The discs are immersed only until the originally vigorous reaction declines noticeably, and are then dropped into a container of alcohol. If the etching is continued too long, mirror-like silicon surfaces are produced on which the electrolytically deposited aluminum will poorly adhere. It is preferable to aluminize the silicon discs soon after the etching process.

Examples of equipment which embody the invention as an electrolytic process are illustrated on the drawing in which.

Figures 1, 2, 3:
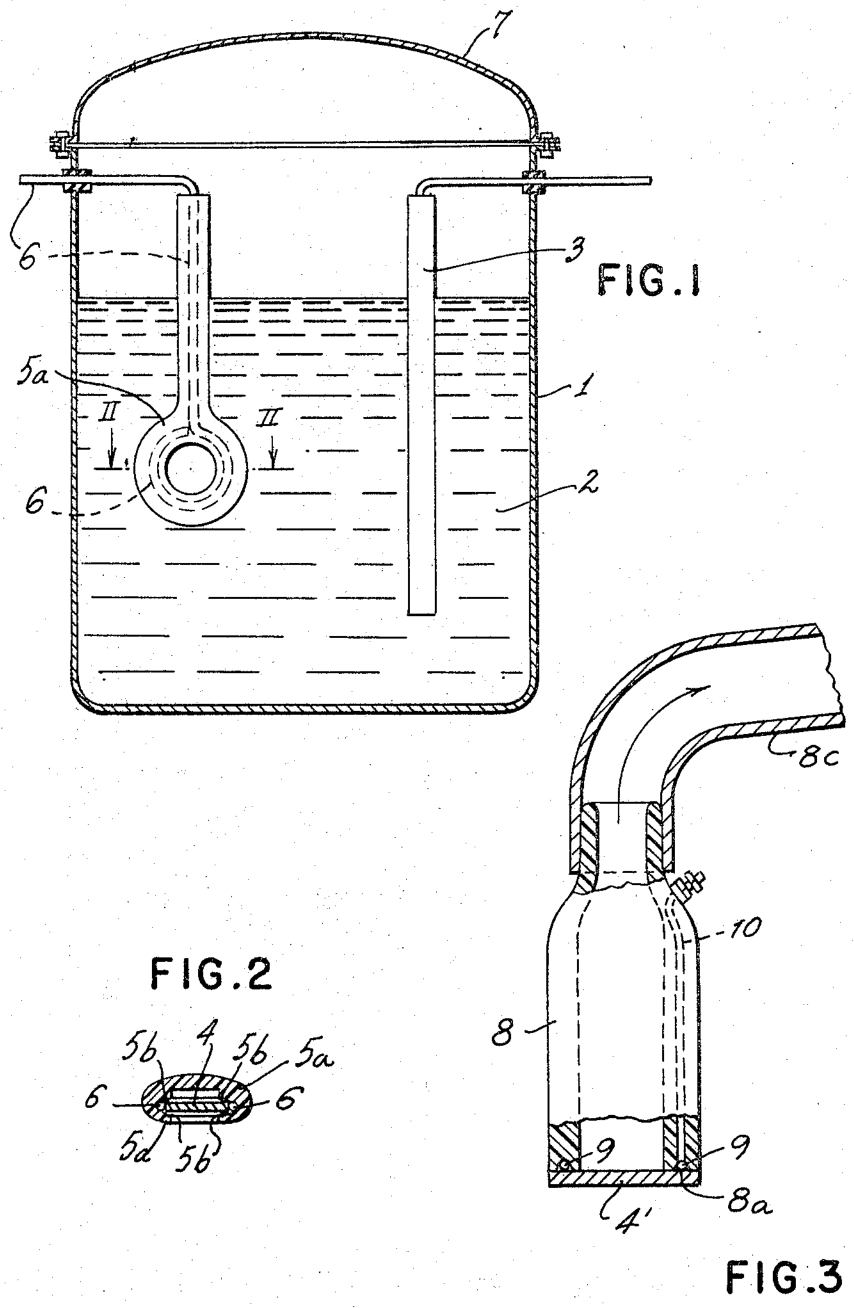
FIG. 1 is a schematic sectional view of an electrolytic processing vessel.
FIG. 2 is a cross section along the line II—II in FIG. 1.
FIG. 3 is a part-sectional view of a modified object holder applicable in equipment otherwise according to FIG. 1.

In FIG. 1, a tank 1 contains the electrolyte 2 which may consist for example of $NaF \cdot 2Al(C_2H_5)_3$. Immersed in the electrolyte is an anode rod 3 of aluminum. A cathode is formed by a semiconductor wafer 4 consisting for example of silicon. The semiconductor body 4 is mounted within a carrier of a material, for example, synthetic material neutral with respect to the electrolyte. Enclosed within the rod-shaped synthetic carrier 5 is an electric lead 6 which extends from the outside to the marginal zone of the semiconductor body 4. The lead 6 is in contact with the edge of the semiconductor body within the synthetic carrier so that the lead is covered at this location during the precipitation process with respect to the ingress of the electrolyte. Consequently, the doping substance in form of aluminum can precipitate from the electrolyte in an effective manner only upon the desired exposed surface of the seciconductor body 4. The carrier 5 in the illustrated embodiment is so shaped that it directly covers one of the two disc surfaces of the semiconductor body so that only the opposite surface is exposed for precipitation of the hyper-pure aluminum from the electrolyte.

The carrier body 5 for the silicon wafer to be processed consists preferably of a material which also possesses resilient mechanical properties so that it can adapt itself to the periphery of the silicon wafer and simultaneously forms a satisfactory seal which prevents the electrolyte from contacting the current supply lead 6. The two electrode leads are to be connected to a suitable source of direct-current voltage.

It is apparent from the cross section shown in FIG. 2 that the bottom portion 5*a* of the carrier 5 is shaped in the form of a flat box. The inner surface at the box opening is provided with an annular recess 5*b* in whose bottom the end of the electric lead 6 or a contact part connected to the lead is mounted or fastened. The groove 5*b* is preferably given an outwardly tapering shape so that the semiconductor disc 4 after being forcibly inserted is reliably held and presses its peripheral edge into the groove of the box wall to provide for the necessary seal. As mentioned, the material of the carrier 5 or at least of its bottom portion 5*a* consists of a sufficiently resilient substance. This resiliency is also important to facilitate inserting the semiconductor body into the groove of the holder. Suitable as material for the holder is polytetrafluoroethylene.

The vessel 1 with the electrolyte is preferably closed and gas-tightly sealed by a cover 7 which permits filling the space above the level of the electrolyte with a protective gas atmosphere such as nitrogen or inert gas.

The modified carrier structure illustrated in FIG. 3 is applicable for the electrolytic process instead of the carrier 5 in equipment otherwise corresponding to FIG. 1. The carrier shown in FIG. 3 has a lower tubular portion 8 whose bottom surface 8*a* is ground or lapped to an accurately planar shape. The semiconductor body 4, consisting of a circular disc is also lapped at its surface in a customary manner, as generally known. When the semiconductor body 4 and the front face 8*a* are placed against each other, a liquid-sealed and, if desired, also gas-sealed contact engagement is directly formed. Consequently when the hollow space in the tubular holder portion 8 is subjected to suction, the semiconductor body is reliably forced against the front face 8*a* of tube 8 and is thus reliably carried and sealed. For this purpose, a source of suction pressure (not shown) is connected to the tubular extension 8*c* of the carrier. A contact spring 9 of annular shape is used for supplying electric current to the semiconductor plate. The spring 9 is connected to a lead 10 embedded in the synthetic insulating material of the tubular portion 8. The ring 9 is inserted into an annular groove in the front face of the tube portion 8.

During electrolysis, the electrolyte is preferably kept at a temperature of 100° C. This can be done by immersing the processing vessel in a paraffin-oil bath and maintaining the bath at 100° C. by means of a heater and a contact thermometer. The temperature of 100° C. is preferable because above 120° C. a thermal decomposition, although very slight, of the electrolyte may take place and the resulting evolving gas may disturb the uniformity of the aluminum precipitation onto the silicon. The conductance of the electrolyte is quite sufficient at 100° C. as stated above.

When performing the electrolysis with a current density of 1.5 ma. per $cm.^2$ for a period of thirty minutes, the resulting aluminum coating on the silicon has a thickness of 0.92 micron. With a processing time of 26 hours, therefore, an approximate layer thickness of 0.05 mm. aluminum is obtained.

The necessary processing time, however, can be greatly reduced by subjecting the anodic surface of the semiconductor body to electromagnetic irradiation. This is illustrated by the following example of test values obtained with testing equipment somewhat modified from the device as shown in FIG. 1. In the modified testing equipment the silicon disc was inserted as a bipolar member between two separate quantities of electrolyte into which respective anodes and cathodes were immersed. The values listed below were obtained with a n-type silicon disc having a specific resistance of 35,000 ohm-cm., a diameter of 0.62 mm., and a radius of 5 mm. When performing the electrolysis in the dark at a temperature of 100° C. the following voltage and current values were measured:

| U, V.: | I, ma. |
|---|---|
| 2.32 | 0.05 |
| 3.55 | 0.10 |
| 9.80 | 0.15 |
| 23.0 | 0.17 |

Silicon photo transistors have greatest sensitivity when being irradiated with a wave length of 0.9 micron. For that reason, it can be expected that the greatest increase in electrolysis current, under otherwise constant conditions, is obtained with radiation sources which are particularly intensive near this wave length. Since when using incandescent lamps, the proportion of radiation in the range of 0.76 to 1.4 microns for a given wattage increases with increasing current intensity, we found it preferable for a given wattage to use a lamp of smallest feasible operating voltage. An incandescent lamp such as an automobile lamp (6 v., 25 watts) may be used, which converts a great proportion of the consumed energy into radiation within the range of 0.76 to 1.4 microns. In order to obtain the highest possible illumination on the silicon disc, the wire helix of the lamp was projected onto the silicon disc with the aid of a quartz lens of short focal length.

When illuminating the anodic surface of the silicon disc with an incandescent lamp (automobile headlight) operated at 6 volts and 25 watts and focused onto the silicon body by means of a quartz collector lens, the following comparative values were obtained:

| U, V.: | I, ma. |
|---|---|
| 1.82 | 0.05 |
| 2.53 | 0.10 |
| 3.17 | 0.15 |
| 3.85 | 0.20 |
| 6.29 | 0.40 |
| 11.7 | 0.80 |

With another small n-conducting silicon disc of 10 ohm-cm. the values measured under the same conditions indicated that at 4 volts a current ratio with and without illumination was approximately 17.

While the improvement achieved by virtue of the invention manifests itself in uniformly good electric qualities of the semiconductor bodies, the difference in comparison with conventionally produced semiconductor devices was also ascertained by visual microscopic inspection. For this purpose, the silicon semiconductor discs coated with aluminum according to the invention were tempered at approximately 700° C. in accordance with the desired alloying or diffusion method. The discs were then sawed into pieces and the cut surfaces were polished and etched and examined under the microscope. For etching, a mixture of hydrofluoric, nitric and acetic acids the same as mentioned above was used. Microscopic inspection at 400 times linear magnification showed that the diffusion zone in the semiconductor body between the aluminum electrode coating and the silicon body was completely planar.

Figure 4:
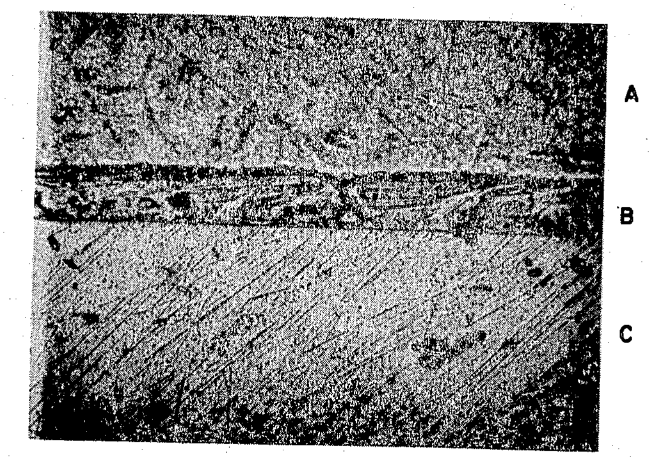
FIGS. 4 and 5 are photomicrographs at 400× magnification showing cross sections of semiconductor bodies treated and coated by the method of the invention.
Figure 5:
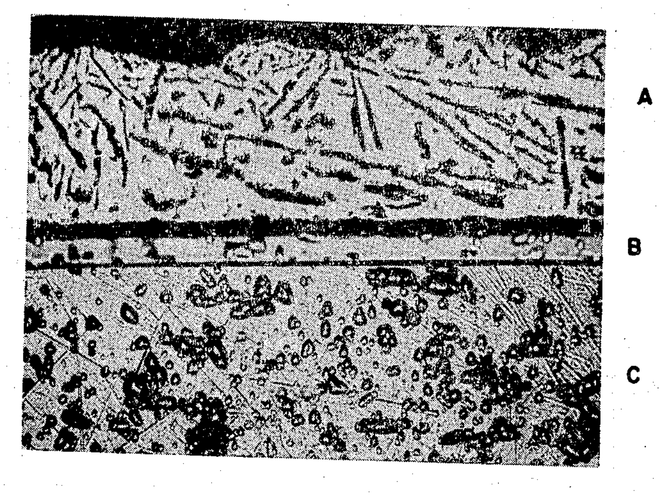
Figure 6:
FIG. 6 is a photomicrograph at 400× magnification showing for comparison purposes an aluminum-coated silicon body treated by a method of the prior art.

Two microphotographs of the type just described are illustrated in FIGS. 4 and 5 in which A denotes the aluminum coating, B the diffusion zone and C the silicon body. For comparison, FIG. 6 shows a microphotograph of an aluminum-coated silicon body in which the surface treatment of the silicon was effected exclusively by etching with sulfuric acid. It will be noted that the diffusion layer B in FIG. 6 is warped and shows projections which may become the cause of electric breakdown.

Aluminum coatings have also been produced by the method of the invention on semiconductor bodies of gallium arsenide (GaAs) with the aid of the same devices as described above, using the same non-aqueous and oxygen-free electrolyte in the manner described.

The electrolytic precipitation of aluminum upon semiconductor materials by the method according to the invention can also be performed with electrolytes other than $NaF \cdot 2Al(C_2H_5)_3$. The relatively small electrolysis currents, predicated upon the semiconductor properties, also permit using electrolytes of small specific electrolytic conductivities. For that reason, practically all thermally sufficiently stable electrolytes are applicable, satisfying the general formulas $$MeR' \cdot AlR(R')_2$$

and $$MeR' \cdot 2AlR(R')_2$$

wherein Me=alkali metal or quarternary ammonium, R=an alkyl group, and R'=an alkyl group or halogen or hydrogen. Relative to the production of aluminum-organic complex salts, reference may be had to Angew. Chem., volume 67, page 213 (1955) and Zeitschrift für anorganic allg. Chem., volume 283, pages 414–424 (1956).

The electrolytes may be diluted with aromatic hydrocarbons in which they are soluble, for example with benzol or toluol, in order to reduce their sensitivity to air. Additions of higher-molecular ethers, such as n-dibutyl ether improve the texture of the aluminum precipitations.

Among the electrolyte-salts of aluminum with quarternary ammonium compounds are those of the general formula $R_4NR' \cdot 2AlR(R')_2$, for example the compound $(C_2H_5)_4NCl \cdot 2Al(C_2H_5)_3$. The specific electrolytic conductances of the complex salts $(CH_3)_4NCl \cdot Al(C_2H_5)_3$ and $(CH_3)_4NCl \cdot 2Al(C_2H_5)_3$ were measured as follows:

| Complex salt | 30° | 50° | 70° | 90° | 110° | 130° | 150° | C. |
|---|---|---|---|---|---|---|---|---|
| 1:1 | ------ | 0.42 | 0.90 | 1.37 | 1.85 | 2.44 | 3.13 | $\cdot 10^{-3}$ ohm$^{-1}$-cm.$^{-1}$ |
| 1:2 (liquid) | 0.35 | 0.62 | 1.03 | 1.44 | 1.89 | 2.43 | 2.99 | $\cdot 10^{-3}$ ohm$^{-1}$-cm.$^{-1}$ |

The 1:2-complex salt was found well suitable for electrolytic separation and deposition of aluminum.

Applicable for precipitation of gallium and indium by the method according to the invention, are gallium and indium alkyl complex salts, analogous to the aluminum compounds. Such gallium and indium compounds can be produced as follows.

By reaction with gallium-triethyl, the alkali metal fluoride complexes of KF, RbF and CsF are obtained, RbF and CsF react with indium-triethyl and form the corresponding complex salts. Particularly favorable complex partners, for the purpose of the invention, however, are the quarternary ammonium salts of gallium and indium.

$KF \cdot Ga(C_2H_5)_3$ forms colorless crystals, melting at about 60° C. and having a small electric conductivity of the melt which At 63.5° C. is $0.2 \cdot 10^{-6}$ ohm$^{-1}$-cm.$^{-1}$
At 128.5° C. is $1.1 \cdot 10^{-6}$ ohm$^{-1}$-cm.$^{-1}$ $KF \cdot 2Ga(C_2H_5)_3$ solidifies at relatively low temperature and then forms a colorless crystal. The compound is liquid at normal room temperature (20° C.). Its electrolytic conductance is sufficiently high, and:

At 35° C. is $4.25 \cdot 10^{-4}$ ohm$^{-1}$-cm.$^{-1}$
At 93° C. is $3.26 \cdot 10^{-4}$ ohm$^{-1}$-cm.$^{-1}$ $(CH_3)_4NCl \cdot Ga(C_2H_5)_3$ forms colorless crystals melting at about 110° C.

$(CH_3)_4NCl \cdot 2Ga(C_2H_5)_3$ forms colorless crystals melting at about 87° C. It has the following electrolytic conductance values at the stated temperatures:

87° C.—$1.4 \cdot 10^{-2}$ ohm$^{-1}$-cm.$^{-1}$
105° C.—$1.87 \cdot 10^{-2}$ ohm$^{-1}$-cm.$^{-1}$
117° C.—$2.07 \cdot 10^{-2}$ ohm$^{-1}$-cm.$^{-1}$
130.5° C.—$2.39 \cdot 10^{-2}$ ohm$^{-1}$-cm.$^{-1}$
143° C.—$2.85 \cdot 10^{-2}$ ohm$^{-1}$-cm.$^{-1}$
153° C.—$3.16 \cdot 10^{-2}$ ohm$^{-1}$-cm.$^{-1}$ $(CH_3)_4NCl \cdot In(C_2H_5)_3$ forms colorless crystals melting between 85 and 95° C. In molten condition the compound has the following electrolytic conductance values:

90° C.—$1.22 \cdot 10^{-2}$ ohm$^{-1}$-cm.$^{-1}$
98° C.—$1.46 \cdot 10^{-2}$ ohm$^{-1}$-cm.$^{-1}$
117° C.—$1.75 \cdot 10^{-2}$ ohm$^{-1}$-cm.$^{-1}$ $(CH_3)_4NCl \cdot 2In(C_2H_5)_3$ forms colorless crystals melting at about 55° C. The melt has the following electrolytic conductance values:

75° C.—$1.16 \cdot 10^{-2}$ ohm$^{-1}$-cm.$^{-1}$
85° C.—$1.32 \cdot 10^{-2}$ ohm$^{-1}$-cm.$^{-1}$
100° C.—$1.43 \cdot 10^{-2}$ ohm$^{-1}$-cm$^{-1}$ The above-mentioned electrolytes are suitable for electrolytic precipitation of gallium and indium on semiconducting bodies of silicon, germanium and others. The use of these electrolytes affords obtaining the precipitate in the required hyperpure condition, and eliminates oxygen and moisture in the same manner as more fully described above.

As mentioned, solutions of the organic complex salts in aromatic hydrocarbons are likewise applicable as electrolytes for the purposes of the invention.

Also as explained, the resistance of the semiconductor can be reduced by increasing the temperature. This can be effected by heating the electrolyte. The electrolyte is in contact with the cathode side of the semiconductor plate and may also be in contact with the anode side if a bipolar circuit connection is being used. As a result, the heated electrolyte conveys heat to the semiconductor plate. A reverse heat transfer takes place if auxiliary radiation is employed for increasing the conductance of the semiconductor plate, particularly heat (red and infrared light) radiation which is especially effective with silicon. At first the silicon plate, which is strongly absorbent in the red and infrared range, is heated, and the plate then imparts its heat to the electrolyte which touches the semiconductor surface and is less absorptive relative to heat radiation. The increase in electric conductivity of the electrolyte with increasing temperature is of minor significance because of the relatively small electrolysis currents.

The heating must be maintained throughout the entire duration of the electrolysis because the cathode current in the apparatus being used is supplied through the semiconductor body; this being the case independently of the particular thickness of the semiconductor plate.

The maximum temperature to which the electrolyte may be heated is approximately 300° C., but such a high temperature is unnecessary in most cases, even with extremely high-ohmic silicon wafers. When using the electrolyte $NaF \cdot 2Al(C_2H_5)_3$, an electrolyte temperature of up to 160° C. can be used; but the electrolysis is preferably performed between 80 and 120° C. Temperatures up to more than 200° C. may be employed with the thermally more stable aluminumtrimethyl complex, for example $NaF \cdot 2Al(CH_3)_3$, if such high temperatures are desirable for any reason.

Obviously, many modifications and variations of the present invention are possible in the light of the above teachings. It is therefore understood, that within the scope of the appended claims, the invention may be practiced otherwise than as specifically described.

We claim:

1. The method of forming a doped junction zone at a surface area of a crystalline semiconductor body selected from the group consisting of silicon and germanium, which comprises subjecting said surface area to a non-aqueous oxygen-free electrolyte whose molecule is devoid of oxygen and comprising a complex compound selected from the group consisting of $$MeR' \cdot AlR(R')_2;\ MeR' \cdot 2AlR(R')_2$$
$$MeR' \cdot GaR(R')_2;\ MeR' \cdot 2GaR(R')_2$$
$$MeR' \cdot InR(R')_2;\ \text{and}\ MeR' \cdot 2InR(R')_2$$

wherein

Me is selected from the group consisting of alkali metal and quaternary ammonia, R is alkyl and R' is selected from the group consisting of alkyl, halogen and hydrogen, electrolytically depositing hyperpure doping substance selected from the group consisting of indium, gallium and aluminum, from the electrolyte onto said area, and heating the body to cause migration of the precipitate into the semiconductor body.

2. The method of forming a doped junction zone on a silicon semiconductor body, which comprises immersing a surface area of the silicon body in a non-aqueous and oxygen-free electrolyte whose molecule is devoid of oxygen and containing an aluminum compound selected from the group consisting of $$MeR' \cdot AlR(R')_2 \text{ and } MeR' \cdot 2AlR(R')_2$$

wherein

Me is selected from the group consisting of alkali metal and quaternary ammonia, R is alkyl and R' is selected from the group consisting of alkyl, halogen and hydrogen, electrolytically precipitating pure aluminum from the compound onto said area, and heating the body to cause migration of the precipitate into the body.

3. The method of forming a doped junction zone on a silicon semiconductor body, which comprises immersing a surface area of the silicon body in a complex salt of aluminum triethyl and an alkali fluoride, electrolytically precipitating pure aluminum from the compound onto said area, and having the body to cause migration of the precipitate into the body.

4. The method of forming a doped junction zone on a silicon semiconductor body, which comprises immersing a surface area of the silicon body in $$NaF \cdot 2Al(C_2H_5)_3$$

electrolytically precipitating pure aluminum from the compound onto said area, and heating the body to cause migration of the precipitate into the body.

5. The method according to claim 1, wherein said compound is $$(CH_3)_4NCl \cdot 2Ga(C_2H_5)_3$$

6. The method according to claim 1, including the step of simultaneously subjecting the semiconductor during the electrolysis process to a treatment which reduces its specific electric resistance.

7. Method according to claim 6, said treatment to reduce the specific resistance comprising heating the silicon body to a maximum temperature of approximately 300° C.

8. Method according to claim 6, said treatment to reduce the specific resistance comprising heating the electrolyte.

9. Method according to claim 6, said treatment to reduce the specific resistance comprising subjecting the semiconductor body to irradiation.

10. Method according to claim 9, said irradiation being in the form of heat.

11. Method according to claim 9, said irradiation being in the form of a photo-effect released near and at the semiconductor surface.

12. Method according to claim 1, said depositing process being effected in an inert protective gas atmosphere.

13. Method according to claim 1, including the step of subjecting the surface of the semiconductor body to a cleaning process prior to said depositing operation.

14. The method according to claim 1, wherein said compound is $$(CH_3)_4NCl \cdot 2In(C_2H_5)_3$$

15. Method of forming a doped junction zone at a surface area of a crystalline semiconductor body, selected from the group consisting of silicon and germanium, which comprises electrolytically coating a portion of a semiconductor cathode area with aluminum from a bath of $$NaF \cdot 2Al(C_2H_5)_3$$

in an oxygen-free environment at a temperature between 80° and 120° C. and heating the coated semiconductor at about 700° C. to diffuse aluminum into the semiconductor.

References Cited

UNITED STATES PATENTS

| | | | |
|---|---|---|---|
| 2,823,175 | 2/1958 | Roschen | 204—15 |
| 2,846,346 | 8/1958 | Bradley | 204—32 |
| 2,849,349 | 8/1958 | Ziegler et al. | 204—14 |
| 2,857,321 | 10/1958 | Williams | 204—32 |
| 2,876,184 | 3/1959 | Geppert | 204—32 |
| 2,945,789 | 7/1960 | Williams | 204—37 |
| 2,958,633 | 11/1960 | Claussen | 204—14 X |
| 3,075,892 | 1/1963 | John et al. | 204—32 |

JOHN H. MACK, *Primary Examiner.*

W. VAN SISE, *Assistant Examiner.*